(12) United States Patent
Huang et al.

(10) Patent No.: US 9,484,418 B2
(45) Date of Patent: Nov. 1, 2016

(54) SEMICONDUCTOR DEVICE

(71) Applicant: DELTA ELECTRONICS, INC., Taoyuan Hsien (TW)

(72) Inventors: Chi-Hsing Huang, Taoyuan Hsien (TW); Ming-Wei Tsai, Taoyuan Hsien (TW); Ching-Chuan Shiue, Taoyuan Hsien (TW); Po-Chin Chuang, Taoyuan Hsien (TW)

(73) Assignee: DELTA ELECTRONICS, INC. (TW)

( * ) Notice: Subject to any disclaimer, the term of this patent is extended or adjusted under 35 U.S.C. 154(b) by 0 days.

(21) Appl. No.: 14/083,777

(22) Filed: Nov. 19, 2013

(65) Prior Publication Data

US 2014/0138701 A1     May 22, 2014

Related U.S. Application Data

(60) Provisional application No. 61/728,136, filed on Nov. 19, 2012.

(51) Int. Cl.

| | |
|---|---|
| *H01L 29/205* | (2006.01) |
| *H01L 29/20* | (2006.01) |
| *H01L 29/778* | (2006.01) |
| *H01L 29/861* | (2006.01) |
| *H01L 27/06* | (2006.01) |
| *H01L 21/8252* | (2006.01) |
| *H01L 27/088* | (2006.01) |

(52) U.S. Cl.
CPC ....... *H01L 29/2003* (2013.01); *H01L 27/0605* (2013.01); *H01L 27/0629* (2013.01); *H01L 29/205* (2013.01); *H01L 29/7787* (2013.01); *H01L 29/861* (2013.01); *H01L 21/8252* (2013.01); *H01L 27/0883* (2013.01); *H01L 2924/0002* (2013.01)

(58) Field of Classification Search
CPC .......... H01L 27/0629; H01L 29/7787; H01L 29/861; H01L 29/2003; H01L 29/205; H01L 27/0605
See application file for complete search history.

(56) References Cited

U.S. PATENT DOCUMENTS

| | | |
|---|---|---|
| 5,192,987 A | 3/1993 | Khan et al. |
| 7,298,123 B2 | 11/2007 | Watanabe et al. |
| 7,382,001 B2 | 6/2008 | Beach |
| 7,898,004 B2 | 3/2011 | Wu et al. |
| 7,915,645 B2 | 3/2011 | Briere |
| 7,965,126 B2 | 6/2011 | Honea et al. |
| 8,017,978 B2 | 9/2011 | Lidow et al. |
| 8,084,783 B2 | 12/2011 | Zhang |

(Continued)

FOREIGN PATENT DOCUMENTS

| | | |
|---|---|---|
| TW | 201036155 | 10/2010 |
| TW | 201246600 | 11/2012 |

*Primary Examiner* — Fazli Erdem
(74) *Attorney, Agent, or Firm* — Hauptman Ham, LLP (57) ABSTRACT

The semiconductor device includes a substrate, a first GaN field effect transistor, a second GaN field effect transistor, and a GaN diode. The first GaN field effect transistor is disposed on or above the substrate, and the first GaN field effect transistor is a depletion mode field effect transistor. The second GaN field effect transistor is disposed on or above the substrate, and the second GaN field effect transistor is an enhancement mode field effect transistor. The GaN diode is disposed on or above the substrate. The first GaN field effect transistor, the second GaN field effect transistor, and the GaN diode are disposed on or above a same side of the substrate and electrically connected to each other.

18 Claims, 7 Drawing Sheets

(56) References Cited

U.S. PATENT DOCUMENTS

| | | | |
|---|---|---|---|
| 8,264,003 B2* | 9/2012 | Herman | 257/194 |
| 2003/0098462 A1* | 5/2003 | Yoshida | 257/183 |
| 2004/0124435 A1* | 7/2004 | D'Evelyn et al. | 257/103 |
| 2008/0173897 A1* | 7/2008 | Cao et al. | 257/192 |
| 2009/0032820 A1 | 2/2009 | Chen | |
| 2009/0278172 A1 | 11/2009 | Kaya et al. | |
| 2009/0278513 A1* | 11/2009 | Bahramian et al. | 323/217 |
| 2010/0073067 A1 | 3/2010 | Honea | |
| 2010/0117095 A1* | 5/2010 | Zhang | 257/76 |
| 2010/0140660 A1* | 6/2010 | Wu et al. | 257/183 |
| 2010/0201439 A1* | 8/2010 | Wu et al. | 327/581 |
| 2010/0301396 A1* | 12/2010 | Briere | 257/195 |
| 2011/0136325 A1 | 6/2011 | Briere | |
| 2011/0157949 A1 | 6/2011 | Bahramian | |
| 2011/0169549 A1* | 7/2011 | Wu | 327/434 |
| 2011/0210338 A1* | 9/2011 | Briere | 257/76 |
| 2011/0284862 A1* | 11/2011 | Zhang | 257/76 |
| 2012/0235160 A1 | 9/2012 | Heikman et al. | |
| 2012/0235209 A1* | 9/2012 | Briere et al. | 257/194 |
| 2012/0241756 A1* | 9/2012 | Zhang et al. | 257/76 |
| 2012/0241819 A1* | 9/2012 | Zhang | 257/195 |
| 2012/0241820 A1* | 9/2012 | Briere et al. | 257/195 |
| 2012/0273797 A1* | 11/2012 | Okada et al. | 257/76 |
| 2013/0009165 A1* | 1/2013 | Park et al. | 257/76 |
| 2013/0074907 A1* | 3/2013 | Saunders | 136/249 |
| 2013/0182470 A1* | 7/2013 | Chen | H02M 7/537 363/56.01 |
| 2013/0241603 A1* | 9/2013 | Chen et al. | 327/109 |
| 2014/0048850 A1* | 2/2014 | Jeon et al. | 257/195 |
| 2014/0049296 A1* | 2/2014 | Jeon et al. | 327/109 |

* cited by examiner

SEMICONDUCTOR DEVICE

RELATED APPLICATIONS

This application claims priority to U.S. Provisional Patent Application Ser. No. 61/728,136, filed Nov. 19, 2012, which is herein incorporated by reference.

BACKGROUND

1. Technical Field

The present disclosure relates to a semiconductor device.

2. Description of Related Art

In recently, the technologies of Si-based semiconductor are developed and have been mature. However, as the sizes of the semiconductor devices become smaller, it brings out some bottlenecks about the device characteristics come from the semiconductor material thereof. Many new technologies of other semiconductor device to replace Si-based semiconductor are therefore presented. The III-V group semiconductor, especially the nitride-based semiconductor material, gallium nitride for example, possesses special spontaneous polarization, high electron saturation velocity, and high breakdown electric field. Since the generation of two dimensional electron gas (2DEG) is caused by spontaneous polarization, the nitride-based semiconductor is received more attentions in the art, especially it can be applied to a normally-off transistor.

The electrical parameters of transistors, such as breakdown voltage, threshold voltage, or switch resistance, need to be tuned in varies ways to satisfy the requirements of different products. However, the adjustments among parameters are usually repelled to each other. For example, one parameter may be deterioration while another parameter is optimized. Thus, an equivalent circuit integrated of plural circuit devices is provided to avoid this situation. However, it still faces some difficulties about how to integrate the nitride-based semiconductor devices since the technologies of the nitride-based semiconductor are not so mature as that of the Si-based semiconductor.

SUMMARY

An aspect of the present invention provides a semiconductor device. The semiconductor device includes a substrate, a first GaN field effect transistor, a second GaN field effect transistor, and a GaN diode. The first GaN field effect transistor is disposed on or above the substrate, and the first GaN field effect transistor is a depletion mode field effect transistor. The second GaN field effect transistor is disposed on or above the substrate, and the second GaN field effect transistor is an enhancement mode field effect transistor. The GaN diode is disposed on or above the substrate. The first GaN field effect transistor, the second GaN field effect transistor, and the GaN diode are disposed on or above a same side of the substrate and electrically connected to each other.

In one or more embodiments, the first GaN field effect transistor is optionally electrically connected in a cascoded configuration with the second GaN field effect transistor, and the GaN diode is connected in parallel with the second GaN field effect transistor.

In one or more embodiments, a drain electrode of the second GaN field effect transistor is optionally electrically connected to a source electrode of the first GaN field effect transistor and a cathode of the GaN diode.

In one or more embodiments, the first GaN field effect transistor, the second GaN field effect transistor, and the GaN diode optionally cooperate to function as a normally-off field effect transistor device.

In one or more embodiments, the semiconductor device optionally further includes a power factor correction diode. An anode of the power factor correction diode is electrically connected to a drain electrode of the first GaN field effect transistor.

In one or more embodiments, the semiconductor device optionally further includes a nitride layer disposed on or above the substrate. The first GaN field effect transistor, the second GaN field effect transistor, and the GaN diode are all disposed on or above the nitride layer.

In one or more embodiments, the first GaN field effect transistor, the second GaN field effect transistor, and the GaN diode optionally include at least one common heterojunction structure, and the heterojunction structure includes a 2DEG channel.

In one or more embodiments, the first GaN field effect transistor optionally includes a heterojunction structure, a source electrode, a drain electrode, and a gate electrode. The heterojunction structure is disposed on or above the substrate, and the heterojunction structure includes a plurality of III-N semiconductor layers and at least one two-dimensional electronic gas (2DEG) channel therein. The source electrode and the drain electrode are separated from each other and electrically coupled with the 2DEG channel. The gate electrode is disposed on or above the heterojunction structure and between the source electrode and the drain electrode.

In one or more embodiments, the second GaN field effect transistor optionally includes a heterojunction structure, a source electrode, a drain electrode, a gate electrode, and a p-type doped layer. The heterojunction structure is disposed on or above the substrate, and the heterojunction structure includes a plurality of III-N semiconductor layers and a one two-dimensional electronic gas (2DEG) channel therein. The source electrode and the drain electrode are separated from each other and electrically coupled with the 2DEG channel. The gate electrode is disposed above the heterojunction structure and between the source electrode and the drain electrode. The p-type doped layer is disposed between the heterojunction structure and the gate electrode.

In one or more embodiments, the p-type doped layer is optionally made of p-GaN or p-AlGaN.

In one or more embodiments, the second GaN field effect transistor optionally includes a heterojunction structure, a source electrode, a drain electrode, and a gate electrode. The heterojunction structure is disposed on or above the substrate, has an inclined portion, and includes a plurality of III-N semiconductor layers and a one two-dimensional electronic gas (2DEG) channel therein. The source electrode and the drain electrode are separated from each other and electrically coupled with the 2DEG channel. The gate electrode is disposed between the source electrode and the drain electrode. At least one portion of the gate electrode is disposed on or above the inclined portion of the heterojunction structure.

In one or more embodiments, the second GaN field effect transistor optionally includes a heterojunction structure, a source electrode, a drain electrode, and a gate electrode. The heterojunction structure is disposed on or above the substrate, has a recess, and includes a plurality of III-N semiconductor layers and a one two-dimensional electronic gas (2DEG) channel therein. The source electrode and the drain electrode are separated from each other and electrically coupled with the 2DEG channel. The gate electrode is disposed between the source electrode and the drain electrode. At least one portion of the gate electrode is disposed on or above the recess of the heterojunction structure.

In one or more embodiments, the GaN diode optionally includes a heterojunction structure, an anode, a cathode, and a p-type doped layer. The heterojunction structure is disposed on or above the substrate. The anode and the cathode are separated from each other and electrically coupled with the heterojunction structure. The p-type doped layer is disposed on or above the heterojunction structure and between the anode and the heterojunction structure.

Another aspect of the present invention provides a semiconductor device. The semiconductor device includes a substrate, a heterojunction structure, a first GaN field effect transistor, a second GaN field effect transistor, an interconnection structure, and a cap layer. The heterojunction structure is disposed on or above the substrate, and the heterojunction structure includes a first region, a second region, and an interconnection region disposed between the first region and the second region. The heterojunction structure creates a 2DEG channel within the heterojunction structure. The first GaN field effect transistor is disposed to include the first region of the heterojunction structure therein. The second GaN field effect transistor is disposed to include the second region of the heterojunction structure therein. The interconnection structure is disposed above the interconnection region of the heterojunction structure and electrically connecting the first GaN field effect transistor and the second GaN field effect transistor. The cap layer is disposed between the interconnection structure and the heterojunction structure. The 2DEG channel is substantially interrupted in the interconnection region of the heterojunction structure under the cap layer.

In one or more embodiments, the cap layer is optionally a p-type doped layer.

In one or more embodiments, the first GaN field effect transistor is optionally a depletion mode field effect transistor, and the second GaN field effect transistor is optionally an enhancement mode field effect transistor.

In one or more embodiments, the interconnection structure optionally electrically connects a drain electrode of the enhancement mode field effect transistor and a source electrode of the depletion mode field effect transistor. A top surface of the interconnection structure, a top surface of the drain electrode of the enhancement mode field effect transistor, and a top surface of the source electrode of the depletion mode field effect transistor are substantially coplanar.

In one or more embodiments, the heterojunction structure optionally includes a first semiconductor layer and a second semiconductor layer disposed on the first semiconductor layer.

In one or more embodiments, the 2DEG channel optionally exists adjacent to an interface between the first semiconductor layer and the second semiconductor layer.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Chemical elements referred in this article are represented by chemical symbols for convenience. That is, aluminum is represented by Al, gallium is represented by Ga, and nitrogen is represented by N.

Figure 1:
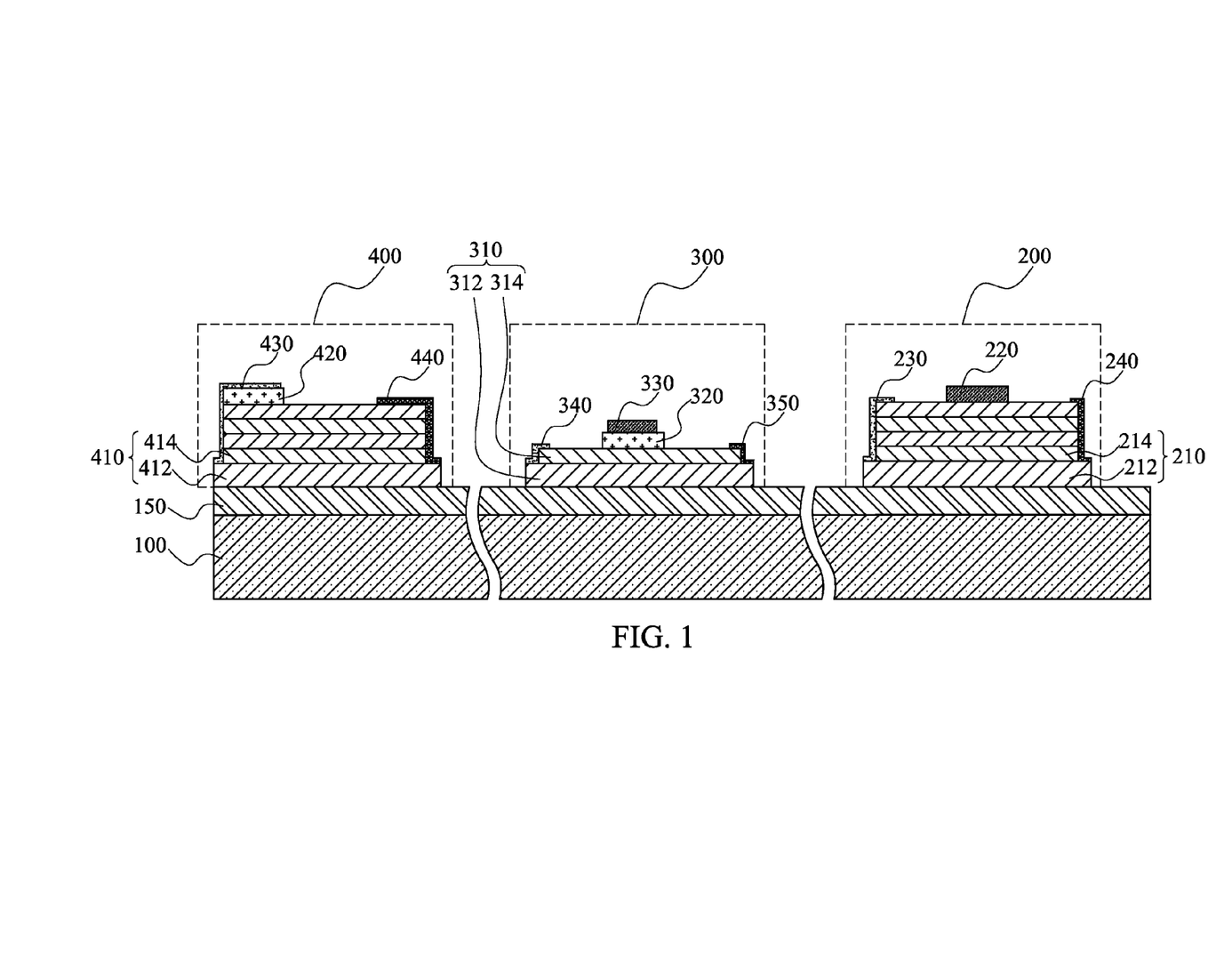
FIG. 1 is a cross-sectional view of a semiconductor device according to one embodiment of the present invention.

FIG. 1 is a cross-sectional view of a semiconductor device according to one embodiment of the present invention. The semiconductor device includes a substrate 100, a first GaN field effect transistor 200, a second GaN field effect transistor 300, and a GaN diode 400. The first GaN field effect transistor 200 is disposed on or above the substrate 100, and the first GaN field effect transistor 200 is a depletion mode field effect transistor. The second GaN field effect transistor 300 is disposed on or above the substrate 100, and the second GaN field effect transistor 300 is an enhancement mode field effect transistor. The GaN diode 400 is disposed on or above the substrate 100. The first GaN field effect transistor 200, the second GaN field effect transistor 300, and the GaN diode 400 are disposed on or above the same side of the substrate 100, and the first GaN field effect transistor 200, the second GaN field effect transistor 300, and the GaN diode 400 are electrically connected to each other. Since the first GaN field effect transistor 200, the second GaN field effect transistor 300, and the GaN diode 400 are all disposed on or above the same side of the substrate 100, the connection resistance among the first GaN field effect transistor 200, the second GaN field effect transistor 300, and the GaN diode 400 can be reduced.

As shown in FIG. 1, the first GaN field effect transistor 200 may include a heterojunction structure 210, a gate electrode 220, a source electrode 230, and a drain electrode 240. The heterojunction structure 210 is disposed on or above the substrate 100 and the heterojunction structure 210 includes a plurality of III-N semiconductor layers 212 and 214, and at least one two-dimensional electronic gas (2DEG) channel therein. The source electrode 230 and the drain electrode 240 are separated from each other, and the source electrode 230 and the drain electrode 240 are electrically coupled with the 2DEG channel. The gate electrode 220 is disposed on or above the heterojunction structure 210 and between the source electrode 230 and the drain electrode 240.

The second GaN field effect transistor 300 may include a heterojunction structure 310, a p-type doped layer 320, a gate electrode 330, a source electrode 340, and a drain electrode 350. The heterojunction structure 310 is disposed on or above the substrate 100, and the heterojunction structure 310 includes two III-N semiconductor layers 312 and 314, and a two-dimensional electronic gas (2DEG) channel therein. The source electrode 340 and the drain electrode 350 are separated from each other, and the source electrode 340 and the drain electrode 350 are electrically coupled with the 2DEG channel. The gate electrode 330 is disposed above the heterojunction structure 310 and between the source electrode 340 and drain electrode 350. The p-type doped layer 320 is disposed between the heterojunction structure 310 and the gate electrode 330.

The GaN diode 400 includes a heterojunction structure 410, a p-type doped layer 420, an anode 430, and a cathode 440. The heterojunction structure 410 is disposed on or above the substrate 100, and the heterojunction structure 410 includes a plurality of III-N semiconductor layers 412 and 414, and at least one two-dimensional electronic gas (2DEG) channel therein. The anode 430 and the cathode 440 are separated from each other, and the anode 430 and the cathode 440 are electrically coupled with the 2DEG channel within the heterojunction structure 410. The p-type doped layer 420 is disposed on or above the heterojunction structure 410 and between the anode 430 and the heterojunction structure 410.

In the present embodiment, the heterojunction structure 210, the heterojunction structure 310, the heterojunction structure 410 are common. That is, the structures and materials of at least one of the heterojunction structure 210, the heterojunction structure 310, and the heterojunction structure 410 are the same. In one or more embodiments, the heterojunction structure 210, the heterojunction structure 310, and the heterojunction structure 410 may include a stack of III-N semiconductor layers, such as GaN/AlGaN stacked layers. In one or more embodiments, each of the layers 212, 312, and 412 comprises $Al_xGa_{1-x}N$ ($0 \leq x \leq 0.3$), and each of the layers 214, 314, 414 comprises $Al_yGa_{1-y}N$ ($0 < y < 0.5$), wherein x is less than y.

In the present embodiment, the p-type doped layer 320 may be made of p-GaN or p-AlGaN. Since the 2DEG channel within the heterojunction structure 310 can be interrupted by the p-type doped layer 320, the second GaN field effect transistor 300 can be a normally-off field effect transistor, i.e. an enhancement mode field effect transistor.

Furthermore, the p-type doped layer 420 may be made of p-GaN or p-AlGaN as well. In one or more embodiment, the p-type doped layer 320 and the p-type doped layer 420 are made of the same material and fabricated in the same process.

Figure 2:
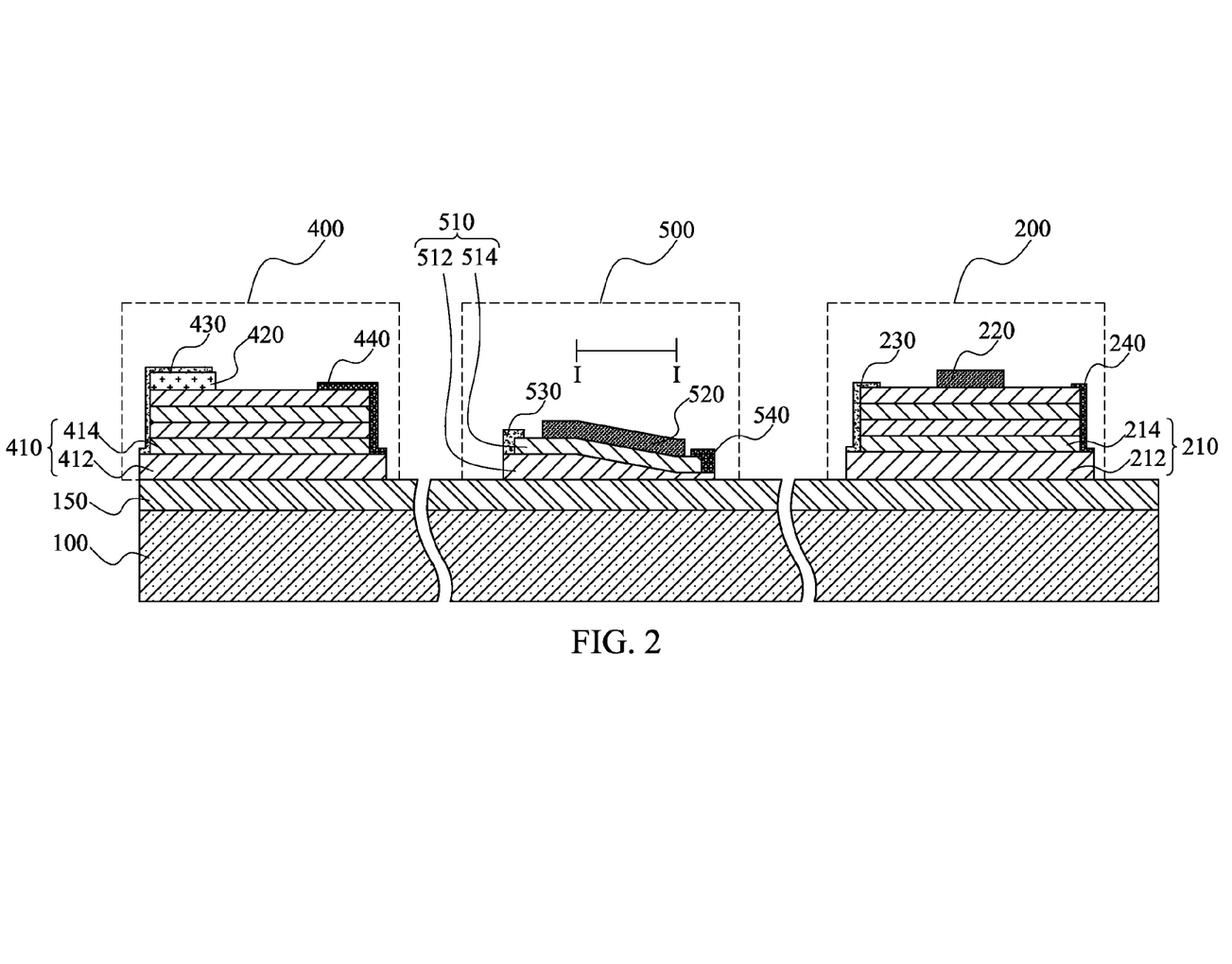
FIG. 2 is a cross-sectional view of a semiconductor device according to another embodiment of the present invention.

FIG. 2 is a cross-sectional view of a semiconductor device according to another embodiment of the present invention. The difference between the semiconductor device of FIG. 2 and the semiconductor device of FIG. 1 is the second GaN field effect transistor. As shown in FIG. 2, the second GaN field effect transistor 500 may include a heterojunction structure 510, a gate electrode 520, a source electrode 530, and a drain electrode 540. The heterojunction structure 510 is disposed on or above the substrate 100, and the heterojunction structure 510 has an inclined portion I-I. Similarly, the heterojunction structure 510 may include a stack of III-N semiconductor layers 512/514 and have a 2DEG channel therein. The source electrode 530 and the drain electrode 540 are separated from each other, and the source electrode 530 and the drain electrode 540 are electrically coupled with the 2DEG channel within the heterojunction structure 510. The gate electrode 520 is disposed between the source electrode 530 and the drain electrode 540, and at least one portion of the gate electrode 520 is disposed on or above the inclined portion I-I of the heterojunction structure 510.

Since the inclined surface of the layer 512 in the portion I-I reduces the 2DEG concentration nearby effectively, the 2DEG channel is substantially interrupted in the inclined portion I-I. Thus, the second GaN field effect transistor 500 can be a normally-off field effect transistor, i.e. an enhancement mode field effect transistor.

As to other relevant structures, materials and process details are all the same as the embodiment shown in FIG. 1, and, therefore, these are not repeated hereinafter.

Figure 3:
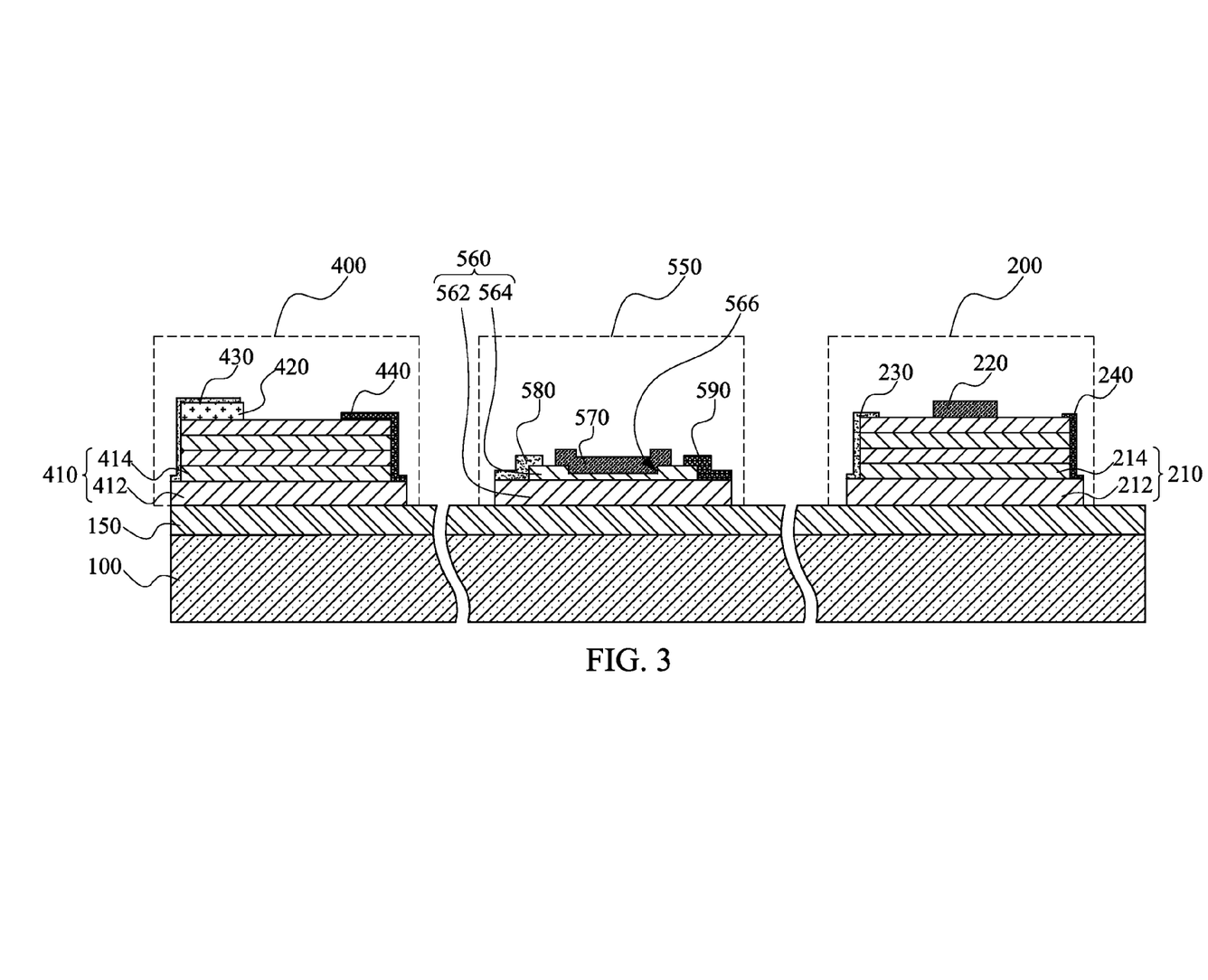
FIG. 3 is a cross-sectional view of a semiconductor device according to yet another embodiment of the present invention.

FIG. 3 is a cross-sectional view of a semiconductor device according to yet another embodiment of the present invention. The difference between the semiconductor device of FIG. 3 and the semiconductor device of FIG. 1 is the second GaN field effect transistor. As shown in FIG. 3, the second GaN field effect transistor 550 may include a heterojunction structure 560, a gate electrode 570, a source electrode 580, and a drain electrode 590. The heterojunction structure 560 is disposed on or above the substrate 100, and the heterojunction structure 560 has a recess 566. Similarly, the heterojunction structure 560 may include a stack of III-N semiconductor layers 562/564. The source electrode 580 and the drain electrode 590 are separated from each other, and the source electrode 580 and the drain electrode 590 are electrically coupled with a 2DEG channel within the heterojunction structure 560. The gate electrode 570 is disposed between the source electrode 580 and the drain electrode 590, and at least one portion of the gate electrode 570 is disposed on or above the recess 566 of the heterojunction structure 560. Since the 2DEG channel is interrupted under the recess 566, the second GaN field effect transistor 550 can be a normally-off field effect transistor, i.e. an enhancement mode field effect transistor.

As to other relevant structures, materials and process details are all the same as the embodiment shown in FIG. 1, and, therefore, these are not repeated hereinafter.

In one or more embodiments, the semiconductor device further includes a nitride layer 150 disposed between the substrate 100 and the devices disposed on or above the substrate 100, such as the first GaN field effect transistor 200, the second GaN field effect transistor 300, 500, or 550, and the GaN diode 400. The nitride layer 150 may be functioned as a buffer layer to reduce defects or dislocations of the devices formed thereon or served as a nuclear layer for fabricating the devices thereon.

Figure 4:
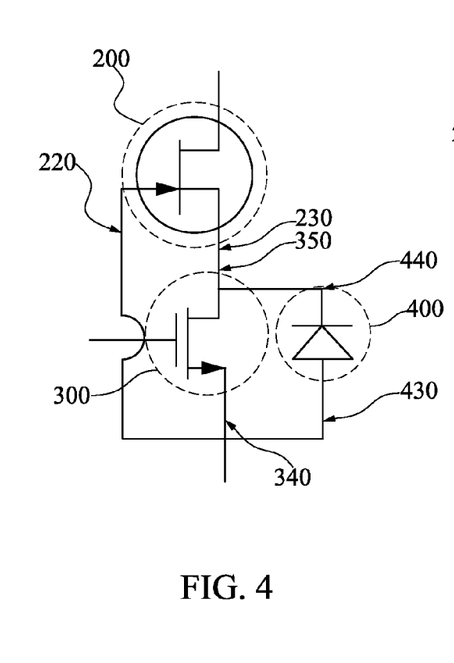
FIG. 4 is a circuit diagram of the semiconductor device of FIG. 1.

FIG. 4 is a circuit diagram of the semiconductor device of FIG. 1. In the present embodiment, the first GaN field effect transistor 200 may be electrically connected in a cascoded configuration with the second GaN field effect transistor 300. The GaN diode 400 may be electrically connected in parallel with the second GaN field effect transistor 300. More specifically, the drain electrode 350 of the second GaN field effect transistor 300 is electrically connected to the source electrode 230 of the first GaN field effect transistor 200 and the cathode 440 of the GaN diode 400, and the source electrode 340 of the second GaN field effect transistor 300 is electrically connected to the anode 430 of the GaN diode 400.

In this way, the first GaN field effect transistor 200, the second GaN field effect transistor 300, and the GaN diode 400 cooperate to function as a normally-off field effect transistor device. Typically, the first GaN field effect transistor 200 is usually designed for high voltage operation and the second GaN field effect transistor 300 is designed for high speed switching. The GaN diode 400 parallel to the second GaN field effect transistor 300 functions as a body diode for improving the switching performance in advance. Therefore, the first GaN field effect transistor 200, the second GaN field effect transistor 300, and the GaN diode 400 can be equivalent to a normally-off field effect transistor device for high voltage and high speed operation.

Figure 5:
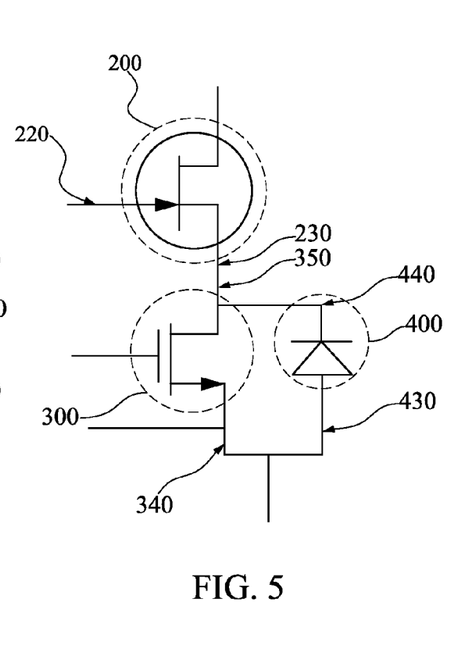
FIG. 5 is a circuit diagram of a semiconductor device according to another embodiment of the present invention.

Although the gate electrode 220 of the first GaN field effect transistor 200 shown in FIG. 4 is electrically connected to the source electrode 340 of the second GaN field effect transistor 300, this should not limit the claimed scope of the present invention. In another embodiment, the gate electrode 220 of the first GaN field effect transistor 200 and the source electrode 340 of the second GaN field effect transistor 300 may be electrically connected to other devices individually for specific purposes, as shown in FIG. 5.

Figure 6:
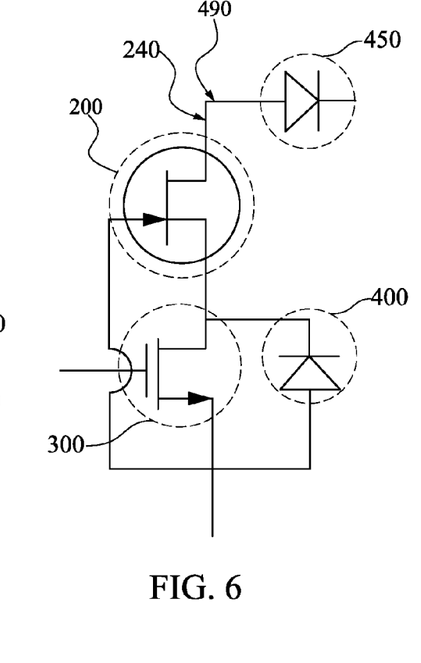
FIG. 6 is a circuit diagram of a semiconductor device according to yet another embodiment of the present invention.

FIG. 6 is a circuit diagram of a semiconductor device according to yet another embodiment of the present invention. The semiconductor device may further include a diode 450. In one embodiment, the diode 450 is functioned as a power factor correction (PFC) diode. The diode 450 may be any kind of diode, for example a Schottky diode, an ultra-fast diode, a silicon carbide diode, a GaN diode, or any combination thereof. The first GaN field effect transistor 200, the second GaN field effect transistor 300, and the GaN diode 400 are all disposed on or above the same side of the substrate 100. An anode 490 of the diode 450 is electrically connected to the drain electrode 240 of the first GaN field effect transistor 200. In one embodiment, the diode 450 is a GaN diode and disposed on the substrate 100 together with the first GaN field effect transistor 200, the second GaN field effect transistor 300, and the GaN diode 400. In another embodiment, the diode 450 is fabricated independently and packaged with the first GaN field effect transistor 200.

In an embodiment, the semiconductor device further comprises a passivation layer covering the first GaN field effect transistor 200, the second GaN field effect transistor 300, and the GaN diode 400. In one embodiment, the semiconductor device further comprises three pads which are individually connected to the drain electrode of the first GaN field effect transistor 200, the gate electrode of the second GaN field effect transistor 300, and the source electrode of the second GaN field effect transistor 300.

In an embodiment, the semiconductor device is mounted on a metal substrate, such as a leadframe, in a flip-chip manner, while each of the pads are facing to the metal substrate. In an embodiment, the metal substrate comprises a first lead, a second lead, and a third lead which are electrically connected to the three pads of the semiconductor device respectively.

Figure 7:
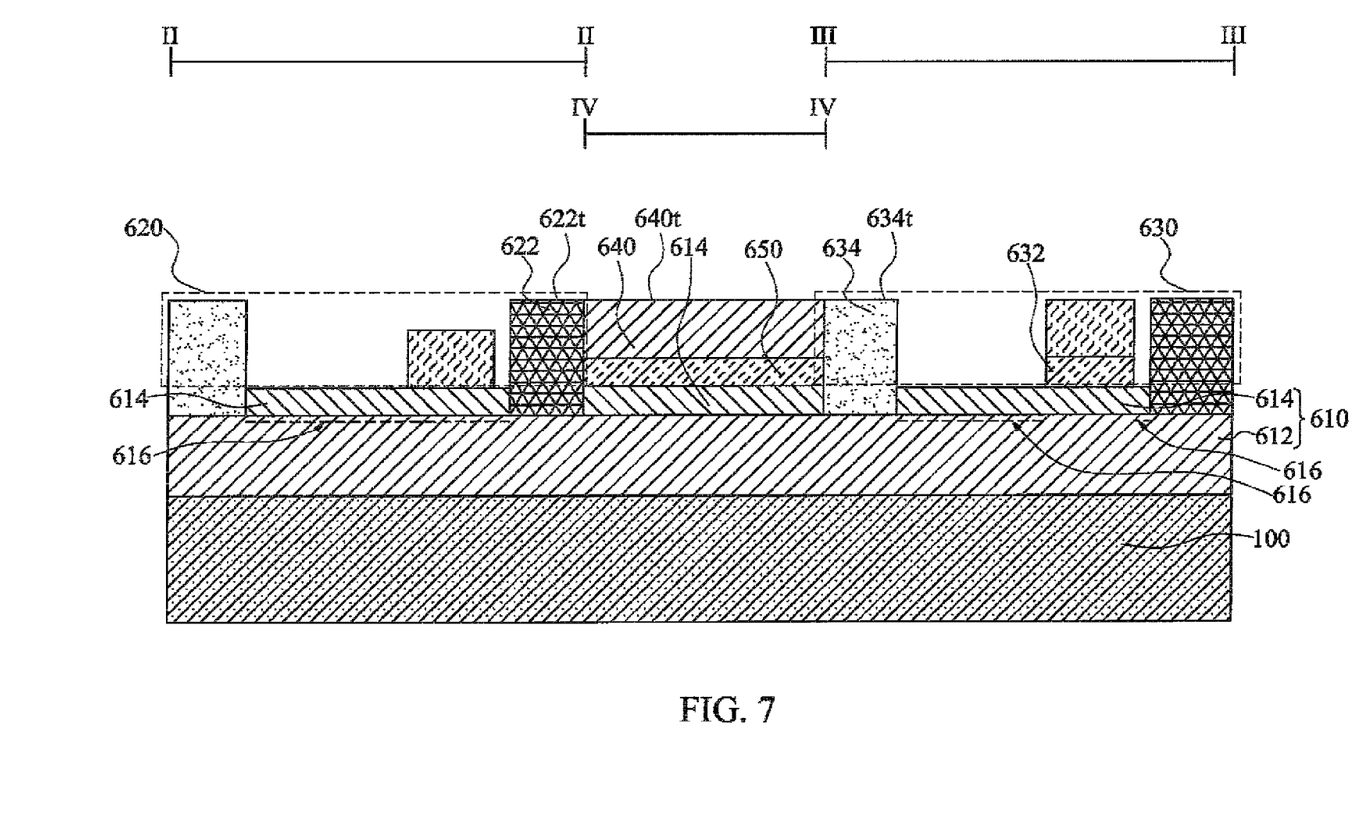
FIG. 7 is a cross-sectional view of a semiconductor device according to still another embodiment of the present invention.

FIG. 7 is a cross-sectional view of a semiconductor device according to another embodiment of the present invention. The semiconductor device includes a substrate 100, a heterojunction structure 610, a first GaN field effect transistor 620, a second GaN field effect transistor 630, an interconnection structure 640, and a cap layer 650. The heterojunction structure 610 is disposed on or above the substrate 100. The heterojunction structure 610 includes a first region II-II, a second region III-III, and an interconnection region IV-IV disposed between the first region II-II and the second region III-III. The heterojunction structure 610 creates a 2DEG channel 616 within the heterojunction structure 610. The first GaN field effect transistor 620 is disposed to include the first region II-II of the heterojunction structure 610 therein. The second GaN device 630 is disposed to include the second region III-III of the heterojunction structure 610 therein. The interconnection structure 640 is disposed above the interconnection region IV-IV of the heterojunction structure 610, and the interconnection structure 640 electrically connects the first GaN field effect transistor 620 and the second GaN field effect transistor 630. The cap layer 650 is disposed between the interconnection structure 640 and the heterojunction structure 610, in which the 2DEG channel 616 in the interconnection region IV-IV of the heterojunction structure 610 is interrupted by the cap layer 650.

The heterojunction structure 610 includes a first semiconductor layer 612, e.g. an i-GaN layer, and a second semiconductor layer 614, e.g. an i-AlGaN layer, disposed on the first semiconductor layer 612. The 2DEG channel 616 therefore exists adjacent to an interface between the first semiconductor layer 612 and the second semiconductor layer 614.

In one or more embodiments, the cap layer 650 may be a p-type doped layer which can interrupt the 2DEG channel 616 in the interconnection region IV-IV of the heterojunction structure 610. The p-type doped layer can be made of, for example, p-GaN or p-AlGaN.

Since the 2DEG channel 616 in the interconnection region IV-IV of the heterojunction structure 610 is interrupted by the cap layer 650, further insulation structure, e.g. an insulation trench, is unnecessary to be formed in the interconnection region IV-IV of the heterojunction structure 610. Furthermore, the electrical connection between the first GaN field effect transistor 620 and the second GaN field effect transistor 630 can be performed by the interconnection structure 640, and therefore further wiring process is unnecessary as well.

In the present embodiment, the first GaN field effect transistor 620 is a depletion mode field effect transistor, and the second GaN field effect transistor 630 is an enhancement mode field effect transistor. Specifically, the second GaN field effect transistor 630 may include a cap layer 632 with p-type doped material between the gate structure and the second region III-III of the heterojunction structure 610, such that the 2DEG channel 616 in the second region III-III of the heterojunction structure 610 is interrupted under the cap layer 632.

In the present embodiment, the interconnection structure 640 electrically connects a source electrode 622 of the first GaN field effect transistor 620, i.e. the depletion mode field effect transistor, to a drain electrode 634 of the second GaN field effect transistor 630, i.e. the enhancement mode field effect transistor. A top surface 640t of the interconnection structure 640, a top surface 622t of the source electrode 622 of the first GaN field effect transistor 620, and a top surface 634t of the drain electrode 634 of the second GaN field effect transistor 630 are substantially coplanar.

Figure 8:
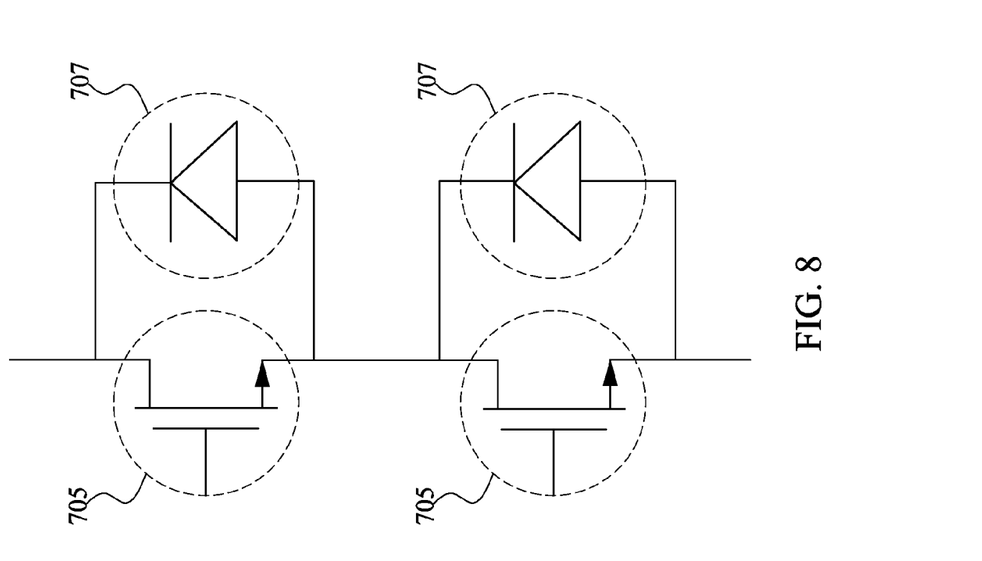
FIGS. 8-11 are circuit diagrams of semiconductor devices according to several embodiments of the present invention.
Figure 9:
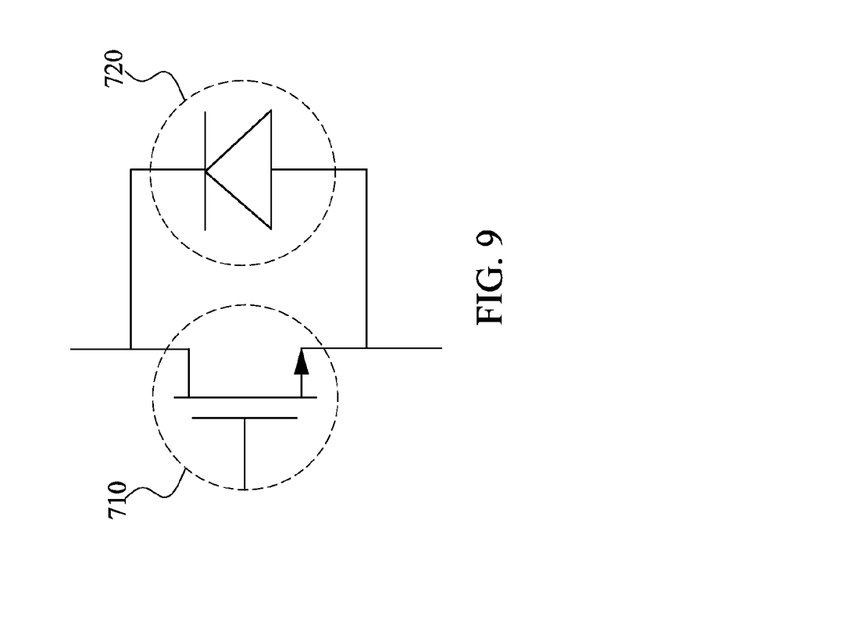
Figure 10:
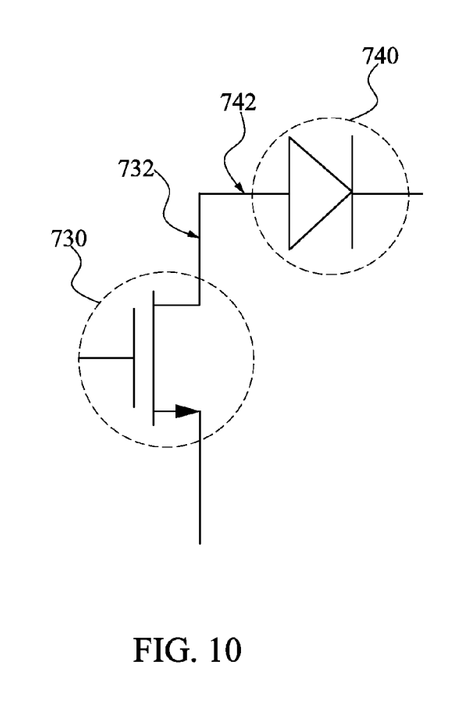
Figure 11:
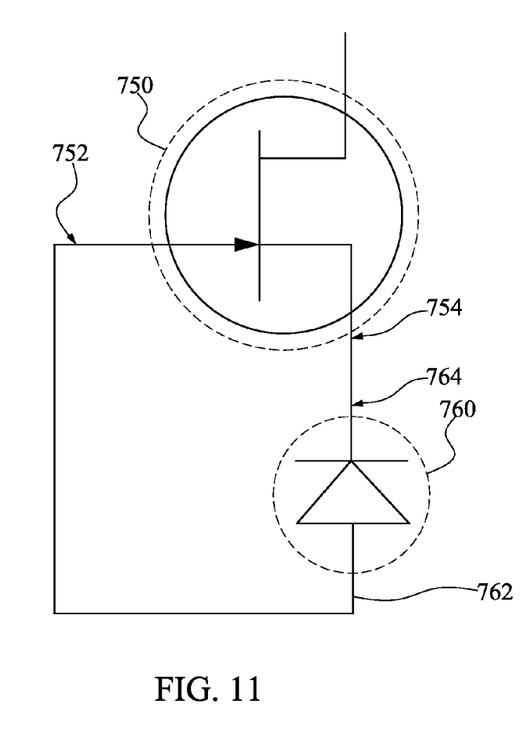

The foregoing designs, e.g. all GaN devices are disposed on the same side of the substrate, and the cap layer is disposed between the interconnection structure and the heterojunction structure, can be applied to various circuits, for example the circuits shown in FIGS. 8-11. As shown in FIG. 8, the semiconductor device may include two enhancement mode GaN field effect transistors 705 electrically connected in a cascoded configuration and two GaN diodes 707 electrically connected in parallel with the enhancement mode GaN field effect transistors 705 respectively. In the case of FIG. 8, the enhancement mode GaN field effect transistors 705 and the GaN diodes 707 can all be disposed on the same side of the substrate, and/or each electrical connection among the enhancement mode GaN field effect transistors 705 and the GaN diodes 707 may employ the cap layer 650 and the interconnection structure 640 shown in FIG. 7. As shown in FIG. 9, the semiconductor device may include an enhancement mode GaN field effect transistor 710 and a GaN diode 720 electrically connected in parallel with the enhancement mode GaN field effect transistor 710. In the case of FIG. 9, the enhancement mode GaN field effect transistor 710 and the GaN diode 720 both can be disposed on the same side of the substrate, and/or each electrical connection between the enhancement mode GaN field effect transistor 710 and the GaN diode 720 may employ the cap layer 650 and the interconnection structure 640 shown in FIG. 7. As shown in FIG. 10, the semiconductor device may include an enhancement mode GaN field effect transistor 730 and a GaN diode 740, wherein the anode 742 of the GaN diode 740 is electrically connected to the drain electrode 732 of the enhancement mode GaN field effect transistor 730. In the case of FIG. 10, the enhancement mode GaN field effect transistor 730 and the GaN diode 740 both can be disposed on the same side of the substrate, and/or each electrical connection between the enhancement mode GaN field effect transistor 730 and the GaN diode 740 may employ the cap layer 650 and the interconnection structure 640 shown in FIG. 7. As shown in FIG. 11, the semiconductor device may include a depletion mode GaN field effect transistor 750 and a GaN diode 760, wherein the cathode 764 of the GaN diode 760 is electrically connected to the source electrode 754 of the depletion mode GaN field effect transistor 750, and the anode 762 of the GaN diode 760 is electrically connected to the gate electrode 752 of the depletion mode GaN field effect transistor 750. In the case of FIG. 11, the depletion mode GaN field effect transistor 750 and the GaN diode 760 both can be disposed on the same side of the substrate, and/or each electrical connection between the depletion mode GaN field effect transistor 750 and the GaN diode 760 may employ the cap layer 650 and the interconnection structure 640 shown in FIG. 7.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor device comprising:
   a substrate;
   a first GaN field effect transistor disposed on or above the substrate, wherein the first GaN field effect transistor is a depletion mode field effect transistor;
   a second GaN field effect transistor disposed on or above the substrate, wherein the second GaN field effect transistor is an enhancement mode field effect transistor;
   a GaN diode disposed on or above the substrate, wherein the first GaN field effect transistor, the second GaN field effect transistor, and the GaN diode are all disposed on or above a same side of the substrate and electrically connected to each other; and
   a power factor correction diode, wherein an anode of the power factor correction diode is electrically connected to a drain electrode of the first GaN field effect transistor.

2. The semiconductor device of claim 1, wherein the first GaN field effect transistor is electrically connected in a cascoded configuration with the second GaN field effect transistor, and the GaN diode is connected in parallel with the second GaN field effect transistor.

3. The semiconductor device of claim 1, wherein a drain electrode of the second GaN field effect transistor is electrically connected to a source electrode of the first GaN field effect transistor and a cathode of the GaN diode.

4. The semiconductor device of claim 1, wherein the first GaN field effect transistor, the second GaN field effect transistor, and the GaN diode cooperate to function as a normally-off field effect transistor device.

5. The semiconductor device of claim 1, further comprising a nitride layer disposed on or above the substrate, wherein the first GaN field effect transistor, the second GaN field effect transistor, and the GaN diode are all disposed on or above the nitride layer.

6. The semiconductor device of claim 1, wherein the first GaN field effect transistor, the second GaN field effect transistor, and the GaN diode comprise at least one common heterojunction structure, and the heterojunction structure comprises at least $Al_xGa_{1-x}N$ (0<x <0.3).

7. The semiconductor device of claim 1, wherein the first GaN field effect transistor comprises:
   a heterojunction structure disposed on or above the substrate, the heterojunction structure comprising a plurality of III-N semiconductor layers and at least one two-dimensional electronic gas (2DEG) channel therein;
   a source electrode and a drain electrode separated from each other and electrically coupled with the 2DEG channel; and
   a gate electrode disposed on or above the heterojunction structure and between the source electrode and the drain electrode.

8. The semiconductor device of claim 1, wherein the second GaN field effect transistor comprises:
   a heterojunction structure disposed on or above the substrate, the heterojunction structure comprising a plurality of III-N semiconductor layers and a two-dimensional electronic gas (2DEG) channel therein;
   a source electrode and a drain electrode separated from each other and electrically coupled with the 2DEG channel;
   a gate electrode disposed above the heterojunction structure and between the source electrode and the drain electrode; and
   a p-type doped layer disposed between the heterojunction structure and the gate electrode.

9. The semiconductor device of claim 8, wherein the p-type doped layer is made of p-GaN or p-AlGaN.

10. The semiconductor device of claim 1, wherein the second GaN field effect transistor comprises:
    a heterojunction structure disposed on or above the substrate, the heterojunction structure comprising a plurality of III-N semiconductor layers and a two-dimensional electronic gas (2DEG) channel therein, and the heterojunction structure having an inclined portion;
    a source electrode and a drain electrode separated from each other and electrically coupled with the 2DEG channel; and
    a gate electrode disposed between the source electrode and the drain electrode, wherein at least one portion of the gate electrode is disposed on or above the inclined portion of the heterojunction structure.

11. The semiconductor device of claim 1, wherein the second GaN field effect transistor comprises:
    a heterojunction structure disposed on or above the substrate, the heterojunction structure comprising a plurality of III-N semiconductor layers and a two-dimensional electronic gas (2DEG) channel therein, and the heterojunction structure having a recess;
    a source electrode and a drain electrode separated from each other and electrically coupled with the 2DEG channel; and
    a gate electrode disposed between the source electrode and the drain electrode, wherein at least one portion of the gate electrode is disposed on or above the recess of the heterojunction structure.

12. The semiconductor device of claim 1, wherein the GaN diode comprises:
   a heterojunction structure disposed on or above the substrate;
   an anode and a cathode separated from each other and electrically coupled with the heterojunction structure; and
   a p-type doped layer disposed on or above the heterojunction structure and between the anode and the heterojunction structure.

13. A semiconductor device comprising:
   a substrate;
   a heterojunction structure disposed on or above the substrate, wherein the heterojunction structure comprises a first region, a second region, and an interconnection region disposed between the first region and the second region, and the heterojunction structure creates a 2DEG channel within the heterojunction structure;
   a first GaN field effect transistor disposed to include the first region of the heterojunction structure therein;
   a second GaN field effect transistor disposed to include the second region of the heterojunction structure therein;
   an interconnection structure disposed above the interconnection region of the heterojunction structure and electrically connecting the first GaN field effect transistor and the second GaN field effect transistor, wherein a top surface of the interconnection structure, a top surface of a drain electrode of the second GaN field effect transistor, and a top surface of a source electrode of the first GaN field effect transistor are substantially coplanar; and
   a cap layer disposed between the interconnection structure and the heterojunction structure, wherein the 2DEG channel is substantially interrupted in the interconnection region of the heterojunction structure under the cap layer, and the heterojunction structure, the first GaN field effect transistor, the second GaN field effect transistor, the interconnection structure, and the cap layer are all disposed on a same side of the substrate.

14. The semiconductor device of claim 13, wherein the cap layer is a p-type doped layer.

15. The semiconductor device of claim 13, wherein the first GaN field effect transistor is a depletion mode field effect transistor, and the second GaN field effect transistor is an enhancement mode field effect transistor.

16. The semiconductor device of claim 15, wherein the interconnection structure electrically connects the drain electrode of the enhancement mode field effect transistor and the source electrode of the depletion mode field effect transistor.

17. The semiconductor device of claim 13, wherein the heterojunction structure comprises a first semiconductor layer and a second semiconductor layer disposed on the first semiconductor layer.

18. The semiconductor device of claim 17, wherein the 2DEG channel exists adjacent to an interface between the first semiconductor layer and the second semiconductor layer.

* * * * *